US010627449B2

(12) United States Patent
Yoon et al.

(10) Patent No.: US 10,627,449 B2
(45) Date of Patent: Apr. 21, 2020

(54) BATTERY PACK STATUS PARALLEL MONITORING DEVICE (71) Applicant: LG CHEM, LTD., Seoul (KR)

(72) Inventors: Ho Byung Yoon, Daejeon (KR); Sang Hoon Lee, Seoul (KR); Jae Dong Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 244 days.

(21) Appl. No.: 15/578,187

(22) PCT Filed: Nov. 23, 2016

(86) PCT No.: PCT/KR2016/013546
§ 371 (c)(1),
(2) Date: Nov. 29, 2017

(87) PCT Pub. No.: WO2017/090978
PCT Pub. Date: Jun. 1, 2017

(65) Prior Publication Data
US 2018/0172769 A1 Jun. 21, 2018

(30) Foreign Application Priority Data
Nov. 27, 2015 (KR) .................. 10-2015-0167997

(51) Int. Cl.
*G01R 31/36* (2020.01)
*G01R 31/382* (2019.01)
(Continued)

(52) U.S. Cl.
CPC ........... *G01R 31/382* (2019.01); *G01R 31/36* (2013.01); *G08C 19/02* (2013.01); *H01M 10/42* (2013.01);
(Continued)

(58) Field of Classification Search
CPC ..... G01R 31/36; G01R 31/382; H01M 10/42; H01M 10/425; H01M 10/488; H01M 2010/4271; H01M 2010/4278
See application file for complete search history.

(56) References Cited

U.S. PATENT DOCUMENTS 7,611,798 B2 * 11/2009 Yoon .................. H01M 2/1072
174/133 B
8,018,205 B2 9/2011 Yasuhito et al.
(Continued)

FOREIGN PATENT DOCUMENTS

CN 101126795 A 2/2008
CN 101331644 A 12/2008
(Continued)

OTHER PUBLICATIONS

International Search Report for PCT/KR2016/013546 (PCT/ISA/210) dated Feb. 21, 2017.
(Continued)

*Primary Examiner* — Mohamed Charioui
(74) *Attorney, Agent, or Firm* — Birch, Stewart, Kolasch & Birch, LLP (57) ABSTRACT

The present invention provides a battery pack state parallel-monitoring device having a battery pack configured with a plurality of battery cells, a cell monitoring unit for measuring a state of the plurality of battery cells, a BMIC for generating a diagnostic signal indicating a state of the battery pack through the cell monitoring unit, a main MCU for receiving the diagnostic signal, and an auxiliary MCU for receiving the diagnostic signal and transmitting/receiving data of the main MCU, the battery pack state parallel-monitoring device including data lines connecting the BMIC and the main MCU to each other, parallel lines connected in parallel to the data lines, and a communication monitoring unit connected to the parallel lines to monitor data trans-
(Continued)

mitted/received between the BMIC and the main MCU and transfer the monitored data to the auxiliary MCU.

3 Claims, 5 Drawing Sheets

(51) Int. Cl.
  *H01M 10/42* (2006.01)
  *G08C 19/02* (2006.01)
  *H04Q 9/00* (2006.01)
  *H01M 10/48* (2006.01)

(52) U.S. Cl.
  CPC ....... *H01M 10/425* (2013.01); *H01M 10/482* (2013.01); *H01M 10/488* (2013.01); *H04Q 9/00* (2013.01); *H01M 2010/4271* (2013.01); *H01M 2010/4278* (2013.01)

(56) References Cited

U.S. PATENT DOCUMENTS

| | | | |
|---|---|---|---|
| 8,639,219 B2 * | 1/2014 | Little | G06F 21/31 320/106 |
| 8,898,341 B2 | 11/2014 | Kim et al. | |
| 8,924,059 B2 | 12/2014 | Yoshikawa et al. | |
| 8,933,671 B2 | 1/2015 | Lee et al. | |
| 9,297,858 B2 | 3/2016 | Lim | |
| 9,505,396 B2 * | 11/2016 | Brochhaus | B60W 10/26 |
| 9,669,723 B2 | 6/2017 | Sugeno et al. | |
| 2005/0268178 A1 | 12/2005 | Hagman | |
| 2008/0088279 A1 | 4/2008 | Lim et al. | |
| 2008/0252257 A1 * | 10/2008 | Sufrin-Disler | B60L 3/0046 320/118 |
| 2011/0254502 A1 | 10/2011 | Yount et al. | |
| 2012/0126820 A1 | 5/2012 | Tan et al. | |
| 2013/0020970 A1 * | 1/2013 | Zhang | B62M 6/45 318/139 |
| 2013/0328530 A1 * | 12/2013 | Beaston | H01M 10/4207 320/128 |
| 2013/0338871 A1 | 12/2013 | Kubo et al. | |
| 2014/0117939 A1 | 5/2014 | Lim | |
| 2014/0149809 A1 | 5/2014 | Bisht et al. | |
| 2015/0285868 A1 * | 10/2015 | Herrmann | H01M 10/4257 702/63 |
| 2016/0311369 A1 * | 10/2016 | Tabatowski-Bush | G01R 31/04 |

FOREIGN PATENT DOCUMENTS

| | | |
|---|---|---|
| CN | 102991371 A | 3/2013 |
| CN | 103620859 A | 3/2014 |
| CN | 103718425 A | 4/2014 |
| CN | 103891097 A | 6/2014 |
| CN | 104081622 A | 10/2014 |
| JP | 4-103241 A | 4/1992 |
| JP | 2003-530685 A | 10/2003 |
| JP | 2004-150821 A | 5/2004 |
| JP | 2006-20380 A | 1/2006 |
| JP | 2013-62981 A | 4/2013 |
| JP | 2013-230037 A | 11/2013 |
| JP | 2014-3742 A | 1/2014 |
| JP | 2014-17901 A | 1/2014 |
| JP | 2014-99952 A | 5/2014 |
| JP | 2014-115088 A | 6/2014 |
| JP | 2015-89212 A | 5/2015 |
| JP | 5715257 B2 | 5/2015 |
| KR | 10-2008-0034352 A | 4/2008 |
| KR | 10-2012-0134611 A | 12/2012 |
| KR | 10-2013-0054766 A | 5/2013 |
| KR | 10-2013-0056347 A | 5/2013 |
| KR | 10-2013-0084875 A | 7/2013 |
| KR | 10-2013-0125137 A | 11/2013 |
| WO | WO 2013/118738 A1 | 8/2013 |

OTHER PUBLICATIONS

European Search Report for Appl. No. 16868874.5 dated Apr. 10, 2018.

* cited by examiner

BATTERY PACK STATUS PARALLEL MONITORING DEVICE

TECHNICAL FIELD

The present invention relates to a battery pack state parallel-monitoring device, and more particularly, to a battery pack state parallel-monitoring device which enables achievement of a high-level safety mechanism by using a simple parallel structure including a parallel line connected to a communication line which connects a communication unit and a main MCU to each other and a communication monitoring unit which monitors data transmitted/received between the communication unit and the MCT through the parallel line.

BACKGROUND ART

Recently, research and development of secondary batteries has been actively carried out. Here, the secondary batteries, which are rechargeable batteries, represent both conventional Ni/Cd batteries and Ni/MH batteries and up-to-date lithium ion batteries. The lithium ion batteries among the secondary batteries have the merit of high energy density compared to the conventional Ni/Cd batteries or Ni/MH batteries. Furthermore, the lithium ion batteries can be made small in size and light in weight, and are thus used as power sources of mobile devices. Moreover, since the scope of use of the lithium ion batteries extend to power sources of electric vehicles, the lithium ion batteries attract attention as next-generation energy storage media.

Meanwhile, a battery pack state monitoring system used in a vehicle requires a high-level safety mechanism so as to monitor, without error, situations that may be dangerous for a vehicle or a driver. For example, a BMIC of a battery management system (BMS) of an electric vehicle measures state information such as a voltage, a current, a temperature, and the like of a battery pack by controlling operation of a cell monitoring unit such as an analog front end (AFE), and generates a diagnostic signal from the measured state information to transfer the diagnostic signal to a main MCU and an auxiliary MCU via communication in a vehicle. The main MCU and the auxiliary MCU receives the diagnostic signal from the BMIC to monitor the state of the battery pack. Here, since the operation of monitoring the state of a battery pack per se directly affects the safety of a driver, constituent units for monitoring the state of a battery pack should be designed to satisfy safety requirements.

In order to satisfy high-level safety requirements, conventional battery pack monitoring systems employ a technology for measuring and diagnosing a battery pack by additionally designing a BMIC and a circuit stage or a technology for measuring and diagnosing a battery pack by replacing an existing main MCU for a battery pack monitoring system with a high-performance main MCU having specifications that satisfy high-level safety requirements.

However, the technologies for designing the conventional battery pack monitoring systems for satisfying high-level safety requirements have a problem wherein the cost for production increases. Furthermore, according to the technologies for designing the conventional battery pack monitoring systems, the size of a manufactured product increases since the volume of a BMS increases due to the additionally designed BMIC and circuit stage.

Therefore, it is required to develop a battery pack state parallel-monitoring device, which enables the achievement of a safety mechanism that satisfies high-level safety requirements without additionally designing a BMIC and a circuit stage in a battery monitoring system or replacing an existing main MCU with a high-performance main MCU.

DISCLOSURE OF THE INVENTION

Technical Problem

The present invention provides a battery pack state parallel-monitoring device capable of satisfying high-level safety requirements without increasing the cost of production in comparison with conventional battery pack monitoring systems in which a BMIC and a circuit stage are additionally designed or a high-performance BMIC is used.

Furthermore, the present invention provides a battery pack state parallel-monitoring device capable of satisfying high-level safety requirements without increasing the volume in comparison with conventional battery pack monitoring systems in which a BMIC and a circuit stage are additionally designed.

Technical Solution

A battery pack state parallel-monitoring device having a battery pack configured with a plurality of battery cells, a cell monitoring unit for measuring a state of the plurality of battery cells, a BMIC for generating a diagnostic signal indicating a state of the battery pack through the cell monitoring unit, a main MCU for receiving the diagnostic signal, and an auxiliary MCU for receiving the diagnostic signal and transmitting/receiving data of the main MCU, according to an embodiment of the present invention includes: data lines connecting the BMIC and the main MCU to each other; parallel lines connected in parallel to the data lines; and a communication monitoring unit connected to the parallel lines to monitor data transmitted/received between the BMIC and the main MCU and transfer the monitored data to the auxiliary MCU.

The monitoring unit may transfer the monitored data to the auxiliary MCU regardless of whether the main MCU has received data normally from the BMIC via the communication unit.

The battery pack state parallel-monitoring device may further include a control unit configured to control an operation state of the communication monitoring unit.

The battery pack state parallel-monitoring device may further include a storage unit configured to pre-store operation execution time information indicating a time consumable by the main MCU which has received the diagnostic signal from the BMIC to start execution of an operation corresponding to the diagnostic signal, wherein the control unit may determine whether the main MCU performs the operation within the time indicated by the operation execution time information when the main MCU has received the diagnostic signal from the BMIC, may generate an operation execution command signal for instructing the auxiliary MCU to immediately perform the operation corresponding to the diagnostic signal when the main MCU does not perform the operation within the time indicated by the operation execution time information as a result of the determination, and may transfer the execution command signal to the auxiliary MCU via the communication monitoring unit so that the operation is performed.

The communication monitoring unit may be configured with a 3-state buffer.

Advantageous Effects

A battery pack state parallel-monitoring device according to an embodiment of the present invention may satisfy high-level safety requirements without increasing the cost of production in comparison with conventional battery pack monitoring systems in which a BMIC and a circuit stage are additionally designed or a high-performance BMIC is used, since an auxiliary MCU may perform a high-level safety mechanism through a communication monitoring unit which monitors data transmitted/received between an BMIC and a main MCU.

Furthermore, the battery pack state parallel-monitoring device according to an embodiment of the present invention may satisfy high-level safety requirements without increasing the volume of a BMS in comparison with a conventional technique of additionally designing a BMIC and a circuit stage, by adding a communication monitoring unit and a control unit to a battery pack monitoring system.

MODE FOR CARRYING OUT THE INVENTION

Hereinafter, embodiments of the present invention will now be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A battery pack according to an embodiment of the present invention may store electric energy and may provide stored electric energy. This battery pack may include a plurality of rechargeable battery cells.

Furthermore, the battery pack may include a batter module configured with a predetermined number of battery cells. That is, since the battery pack may include at least one battery module, the battery pack may include a plurality of battery cells.

Furthermore, in the case where a plurality of battery modules constitute a battery pack, the battery modules may be electrically connected to each other using various methods such as a serial manner and/or a parallel manner so as to satisfy a specification of a load, a battery, or the like.

Furthermore, in the case where a plurality of battery cells constitute a battery module, the battery cells may be electrically connected to each other using various methods such as a serial manner and/or a parallel manner. Here, the type of the battery cell is not particularly limited. For example, the battery cell may include a lithium ion cell, a lithium polymer cell, a nickel cadmium cell, a nickel hydride cell, a nickel zinc cell, etc.

In order to assist with an understanding of a battery pack monitoring system including a battery pack state parallel-monitoring device according to an embodiment of the present invention, a design technology of a conventional battery pack monitoring system will be described with reference to FIGS. 1 to 3.

1. Example of a Conventional Battery Pack Monitoring System

Figure 1:
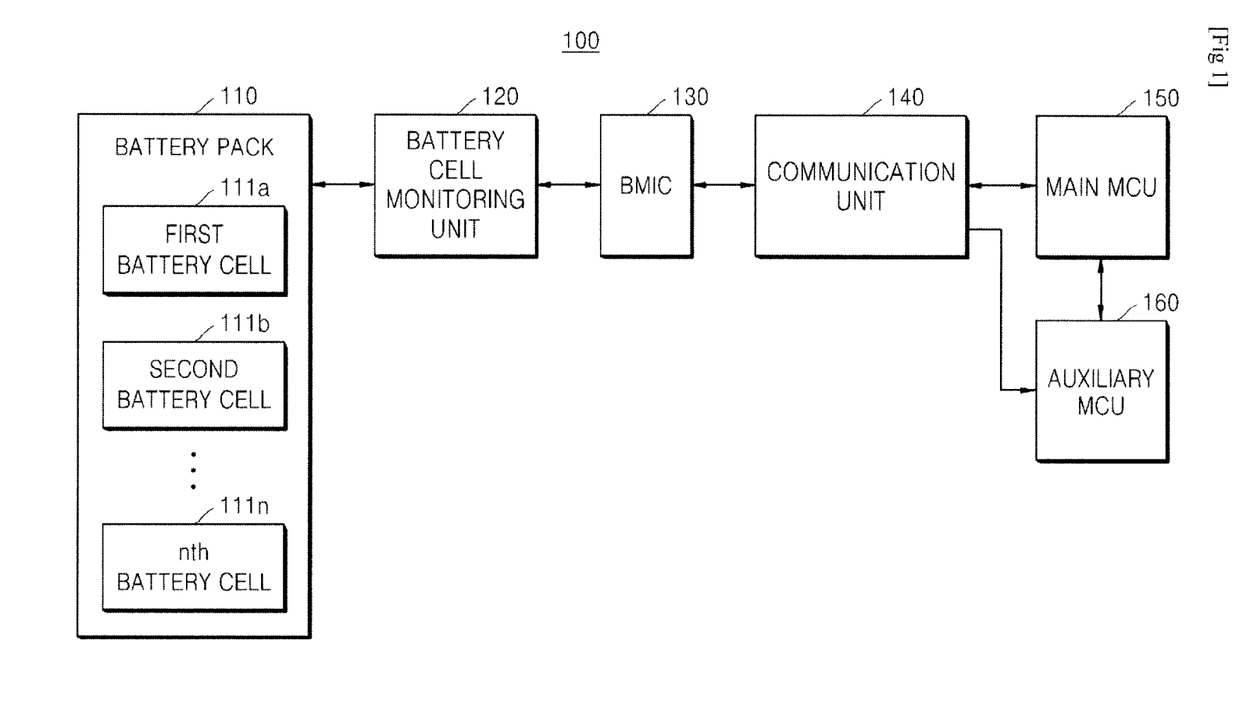
FIG. 1 is a configuration diagram illustrating a conventional battery pack monitoring system.

FIG. 1 is a configuration diagram illustrating a conventional battery pack monitoring system.

Referring to FIG. 1, a conventional battery pack monitoring system 100 includes a battery pack 110, a battery cell monitoring unit 120, a BMIC 130, a communication unit 140, a main MCU 150, and an auxiliary MCU 160.

The battery pack 110 includes a plurality of battery cells 111 (111a, 111b, 111n).

The battery cell monitoring unit 120 measures a voltage value, a current value, a temperature value, and the like from the plurality of battery cells 111 (111a, 111b, 111n) included in the battery pack 110 in response to control of the BMIC 130 to generate a state signal indicating the state of the battery pack.

Thereafter, the battery cell monitoring unit 120 transfers the generated state signal to the BMIC 130.

The BMIC 130 receives the state signal generated by the battery cell monitoring unit 120, and generates, from the received state signal, a diagnostic signal indicating a diagnosis according to the state of the battery pack 110.

Thereafter, the BMIC 130 transfers the generated diagnostic signal to the main MCU 150 and the auxiliary MCU 160 via the communication unit 140 according to a predetermined communication method.

The communication unit 140 transmits/receives data between the BMIC 130 and the main MCU 150 or between the BMIC 130 and the auxiliary MCU 160 according to a predetermined communication method.

The main MCU 150 may receive the diagnostic signal from the BMIC 130 via the communication unit 140, and may perform an operation corresponding to the received diagnostic signal. Here, the operation represents an operation related to a safety mechanism.

The auxiliary MCU 160 may receive the diagnostic signal from the BMIC 130 via the communication unit 140, and may transmit/receive data to/from the main MCU 150.

Furthermore, the auxiliary MCU 160 may determine whether to perform an operation as an auxiliary of an operation related to a safety mechanism according to whether the main MCU 150 performs a corresponding operation according to a received diagnostic signal, and may perform an auxiliary operation related to the safety mechanism when the auxiliary operation is required to be performed as a result of determination.

2. Example of a Conventional Battery Pack Monitoring System in which a BMIC and a Circuit Stage are Additionally Designed FIG. 2 is a configuration diagram illustrating a conventional battery pack monitoring system in which a BMIC and a circuit stage are additionally designed.

Figure 2:
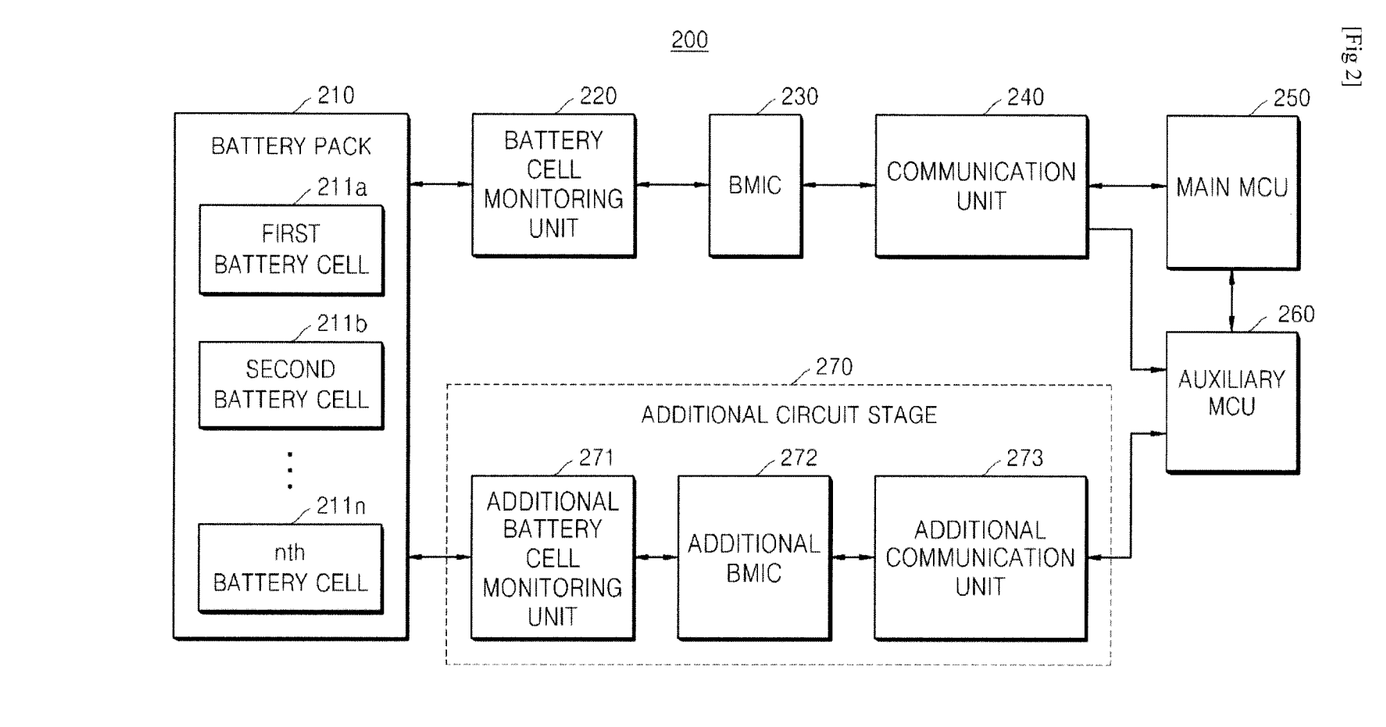
FIG. 2 is a configuration diagram illustrating a conventional battery pack monitoring system in which a BMIC and a circuit stage are additionally designed.
Figure 3:
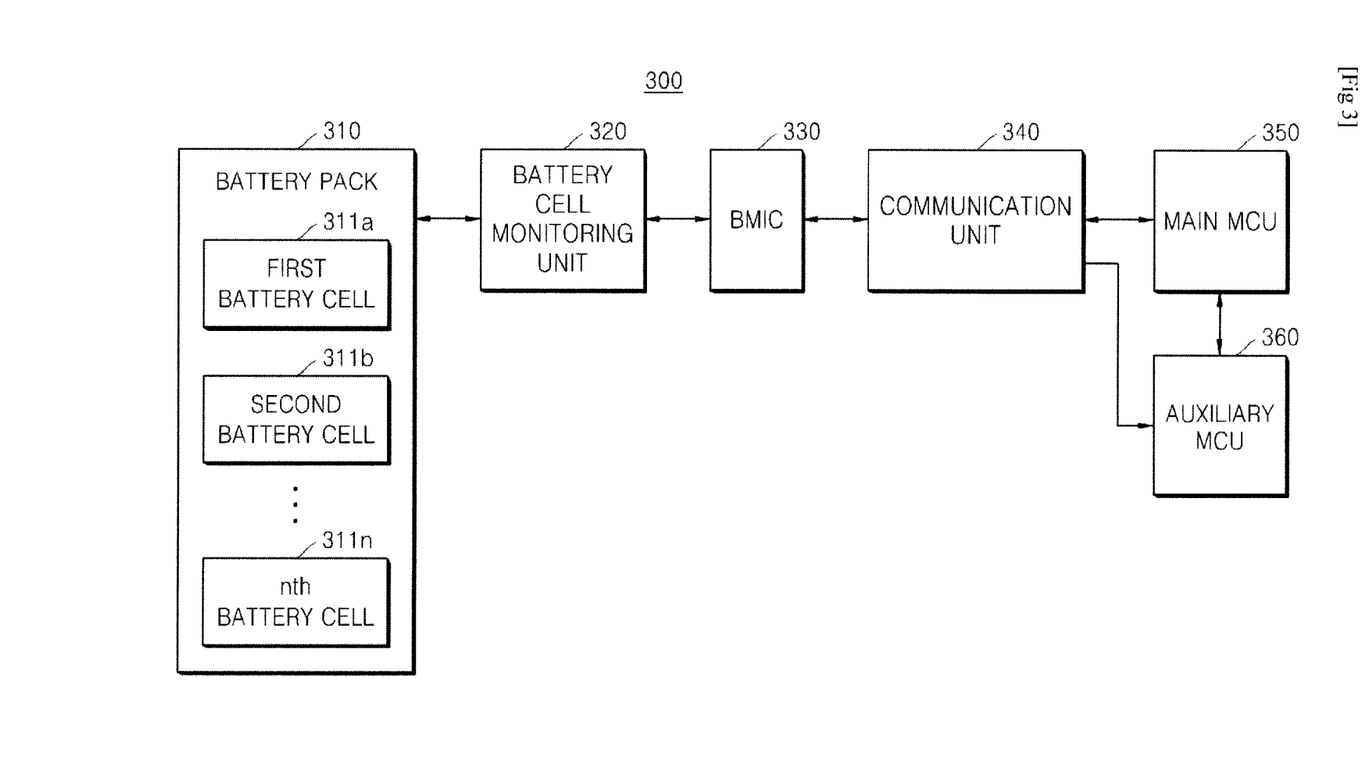
FIG. 3 is a configuration diagram illustrating a conventional battery pack monitoring system in which a main MCU is replaced with a high-performance MCU.

Referring to FIG. 2, a conventional battery pack monitoring system 200 in which a BMIC and a circuit stage are additionally designed includes a battery pack 210, a battery cell monitoring unit 220, a BMIC 230, a communication unit 240, a main MCU 250, an auxiliary MCU 260, and an additional circuit stage 270.

Detailed descriptions of the battery pack 210, the battery cell monitoring unit 220, the BMIC 230, the communication unit 240, the main MCU 250, and the auxiliary MCU 260 of the conventional battery pack monitoring system 200 in which a BMIC and a circuit stage are additionally designed are the same as the descriptions of the battery pack 110, the battery cell monitoring unit 120, the BMIC 130, the communication unit 140, the main MCU 150, and the auxiliary MCU 160 of the conventional battery pack monitoring system 100 illustrated in FIG. 1, and are thus omitted below.

The additional circuit stage 270 includes an additional battery cell monitoring unit 271, an additional BMIC 272, and an additional communication unit 273.

The additional battery cell monitoring unit 271 measures a voltage value, a current value, a temperature value, and the like from a plurality of battery cells 211 (211*a*, 211*b*, 211*n*) included in the battery pack 210 in response to control of the additional BMIC 272 to generate a state signal indicating the state of the battery pack.

Thereafter, the additional battery cell monitoring unit 271 transfers the generated state signal to the additional BMIC 272.

The additional BMIC 272 receives the state signal generated by the additional battery cell monitoring unit 271, and generates, from the received state signal, a diagnostic signal indicating a diagnosis according to the state of the battery pack 210.

Thereafter, the additional BMIC 272 transfers the generated diagnostic signal to the auxiliary MCU 260 via the additional communication unit 273 according to a predetermined communication method.

The additional communication unit 273 transmits/receives data between the additional BMIC 272 and the auxiliary MCU 260 according to a predetermined communication method.

The auxiliary MCU 260 may receive the diagnostic signal from the BMIC 230 via the communication unit 240.

Furthermore, the auxiliary MCU 260 may receive the diagnostic signal from the additional BMIC 272 via the additional communication unit 273 of the additional circuit stage.

Furthermore, the auxiliary MCU 260 may transmit/receive data to/from the main MCU 250.

Furthermore, the auxiliary MCU 260 may determine whether to perform an operation as an auxiliary of an operation related to a safety mechanism according to whether the main MCU 250 performs a corresponding operation according to a received diagnostic signal, and may perform an auxiliary operation related to the safety mechanism when the auxiliary operation is required to be performed as a result of determination.

The conventional battery pack monitoring system 200 described above with reference to FIG. 2, in which a BMIC and a circuit stage are additionally designed, may perform a higher-level safety mechanism than that of the conventional battery pack monitoring system 100 described above with reference to FIG. 1, but has disadvantages of increasing the cost of producing a BMS and increasing the volume of a produced BMS.

3. Example of a Conventional Battery Pack Monitoring System in which a Main MCU is Replaced with a High-Performance MCU FIG. 3 is a configuration diagram illustrating a conventional battery pack monitoring system in which a main MCU is replaced with a high-performance MCU.

A conventional battery pack monitoring system 300 in which a main MCU is placed with a high-performance MCU includes a battery pack 310, a battery cell monitoring unit 320, a BMIC 330, a communication unit 340, a high-performance MCU 350, and an auxiliary MCU 360.

Detailed descriptions of the battery pack 310, the battery cell monitoring unit 320, the BMIC 330, the communication unit 340, and the auxiliary MCU 260 of the conventional battery pack monitoring system 300 in which a main MCU is replaced with a high-performance MCU are the same as the descriptions of the battery pack 110, the battery cell monitoring unit 120, the BMIC 130, the communication unit 140, and the auxiliary MCU 160 of the conventional battery pack monitoring system 100 illustrated in FIG. 1, and are thus omitted below.

The high-performance MCU 350 is an MCU which accords with a specification satisfying a high-level safety requirement.

The conventional battery pack monitoring system 300 described above with reference to FIG. 3, in which a main MCU is replaced with a high-performance MCU, may perform a higher-level safety mechanism than that of the conventional battery pack monitoring system 100 described above with reference to FIG. 1, but has the disadvantage of increasing the cost of producing a BMS.

4. Example of a Battery Pack State Parallel-Monitoring System which Includes a Battery Pack State Parallel-Monitoring Device According to an Embodiment of the Present Invention FIG. 4 is a configuration diagram illustrating a battery pack state monitoring system which includes a battery pack state parallel-monitoring device according to an embodiment of the present invention.

Figure 4:
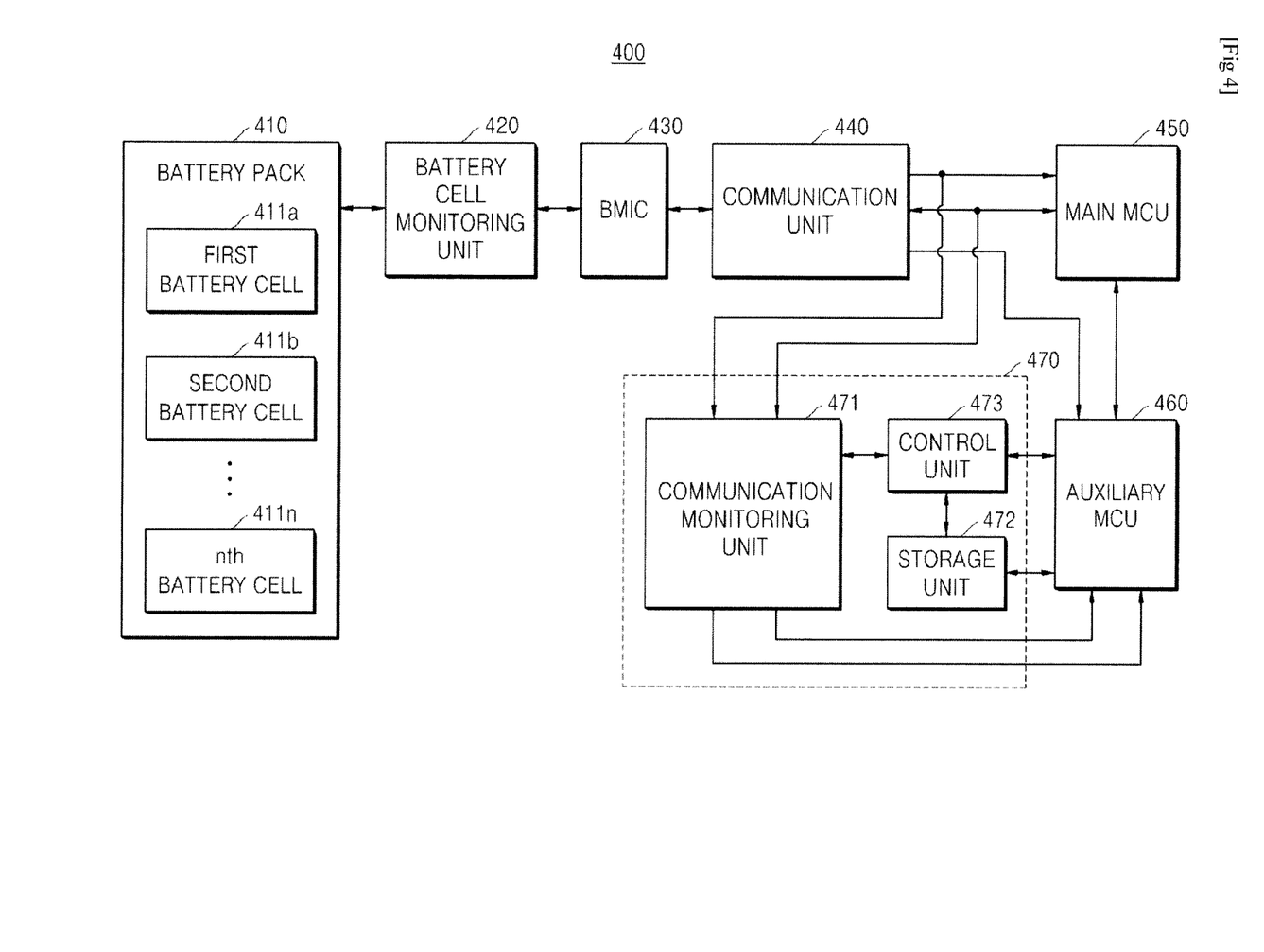
FIG. 4 is a configuration diagram illustrating a battery pack state parallel-monitoring system which includes a battery pack state parallel-monitoring device according to an embodiment of the present invention.

Referring to FIG. 4, a battery pack monitoring system 400 including a battery pack state parallel-monitoring device according to an embodiment of the present invention may include a battery pack 410, a battery cell monitoring unit 420, a BMIC 430, a communication unit 440, a main MCU 450, an auxiliary MCU 460, and a battery pack state parallel-monitoring device 470.

Detailed descriptions of the battery pack 410, the battery cell monitoring unit 420, the BMIC 430, the communication unit 440, the main MCU 450, and the auxiliary MCU 460 of the battery pack monitoring system 400 including the battery pack state parallel-monitoring device according to an embodiment of the present invention are the same as the descriptions of the battery pack 110, the battery cell monitoring unit 120, the BMIC 130, the communication unit 140, the main MCU 150, and the auxiliary MCU 160 of the conventional battery pack monitoring system 100 illustrated in FIG. 1, and are thus omitted below.

The battery pack state parallel-monitoring device 470 according to an embodiment of the present invention may include a communication monitoring unit 471, a storage unit 472, and a control unit 473.

The communication monitoring unit 471 may monitor data transmitted/received between the communication unit 440 and the main MCU 450 in response to control of the control unit 473.

In detail, the communication monitoring unit 471 may monitor the data transmitted/received between the communication unit 440 and the main MCU 450 through parallel lines connected in parallel to data lines which connect the communication unit 440 and the main MCU 450 to each other.

Furthermore, the communication monitoring unit 471 may monitor whether data is transmitted/received through the data lines which connect the communication unit 440 and the main MCU 450, and, if the data is transmitted/received, may receive the data to transfer the data to the auxiliary MCU 460.

Furthermore, the communication monitoring unit 471 may be configured with a 3-state buffer, and an operation state of the communication monitoring unit 471 may be determined according to a control signal.

Furthermore, the communication monitoring unit 471 may transfer monitored data to the auxiliary MCU 460 regardless of whether the main MCU 450 has received data from the BMIC 430 via the communication unit 440.

In more detail, when an operation corresponding to a diagnostic signal is not performed since the diagnostic signal is not received normally by the main MCU 450 even though the BMIC 430 has generated and transferred the diagnostic signal to the main MCU 450 via the communication unit 440, the communication monitoring unit 471 transfers the monitored data to the auxiliary MCU 460 regardless of whether the main MCU 450 has received data from the BMIC 430 via the communication unit 440, so that the auxiliary MCU 460 may perform the operation corresponding to the diagnostic signal, thereby achieving a high-level safety mechanism.

The storage unit 472 may pre-store operation execution time information indicating a time that may be taken for the main MCU 450 which has received the diagnostic signal from the BMIC 430 to start execution of the operation corresponding to the received diagnostic signal.

The control unit 473 may control operation of the communication monitoring unit 471 and the storage unit 472.

Figure 5:
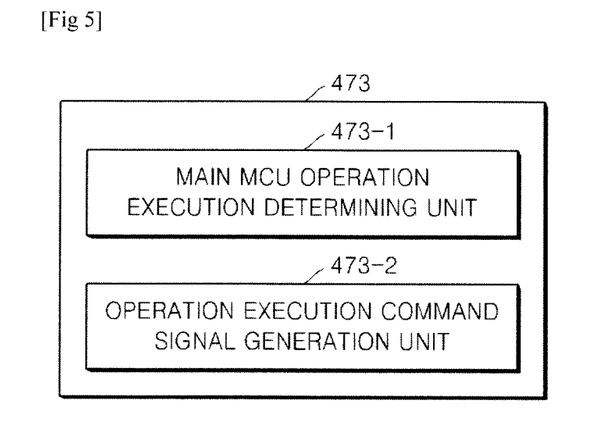
FIG. 5 is a configuration diagram illustrating a control unit of a battery pack state parallel-monitoring device according to an embodiment of the present invention.

Furthermore, the control unit 473 may further include constituent units as illustrated in FIG. 5.

FIG. 5 is a configuration diagram illustrating a control unit of a battery pack state parallel-monitoring device according to an embodiment of the present invention.

Referring to FIG. 5, the control unit 473 of the battery pack state parallel-monitoring device 470 according to an embodiment of the present invention may further include a main MCU operation execution determining unit 473-1 and an operation execution command signal generation unit 473-2.

The main MCU operation execution determining unit 473-1 may determine whether the main MCU 450 performs an operation corresponding to a diagnostic signal within the time indicated by the operation execution time information pre-stored in the storage unit 472, when the main MCU 450 has received the diagnostic signal from the BMIC 430.

When the main MCU 450 does not perform the operation corresponding to the diagnostic signal within the time indicated by the operation execution time information pre-stored in the storage unit 472 as a result of the determination, it may be determined that an auxiliary operation of the auxiliary MCU 460 is required.

When the main MCU operation execution determining unit 473-1 determines that the auxiliary operation of the auxiliary MCU 460 is required, the operation execution command signal generation unit 473-2 may generate an operation execution command signal for instructing the auxiliary MCU 460 to immediately perform an operation corresponding to a received diagnostic signal.

Thereafter, the operation execution command signal generation unit 473-2 may transfer the generated immediate execution command signal to the auxiliary MCU 460 via the communication monitoring unit 471 so that the operation corresponding to the diagnostic signal may be performed.

The battery pack monitoring system 400 including the battery pack state parallel-monitoring device according to an embodiment of the present invention described above with reference to FIGS. 4 and 5 may perform a high-level safety mechanism with a simple circuit configuration in comparison with the conventional battery pack monitoring systems 100, 200, and 300.

Furthermore, since the control unit 473 of the battery pack state parallel-monitoring device 470 according to an embodiment of the present invention determines whether an auxiliary operation is required, a load of the auxiliary MCU 460 may be reduced.

Moreover, when an auxiliary operation for a safety mechanism is required, the battery pack monitoring system 400 including the battery pack state parallel-monitoring device according to an embodiment of the present invention may quickly perform the auxiliary operation for the safety mechanism in comparison with the conventional battery pack monitoring systems 100, 200, and 300.

Although the technical concept of the present invention has been specifically described according to the above-mentioned embodiment, it should be noted that the above-mentioned embodiment is not for limiting the present invention but for describing the present invention. Furthermore, those skilled in the art could understand that various embodiments can be made within the scope of the technical concept of the present invention.

What is claimed is:

1. A battery pack state parallel-monitoring device having a battery pack configured with a plurality of battery cells, a cell monitoring unit for measuring a state of the plurality of battery cells, a BMIC for generating a diagnostic signal indicating a state of the battery pack through the cell monitoring unit, a communication unit for transmitting/receiving data between the BMIC and a main MCU and data between the BMIC and an auxiliary MCU, the main MCU for receiving the diagnostic signal, and the auxiliary MCU for receiving the diagnostic signal and transmitting/receiving data of the main MCU, the battery pack state parallel-monitoring device comprising:
    data lines configured to transmit/receive data from the BMIC to the main MCU through the communication unit;
    parallel lines connected in parallel to the data lines; and
    a communication monitoring unit connected to the parallel lines to monitor data transmitted/received from the BMIC and the main MCU through the communication unit and transfer the monitored data to the auxiliary MCU;
    a control unit configured to control an operation state of the communication monitoring unit; and
    a storage unit configured to pre-store operation execution time information indicating a time consumable by the main MCU which has received the diagnostic signal from the BMIC to start execution of an operation corresponding to the diagnostic signal,
    wherein the control unit determines whether the main MCU performs the operation within the time indicated by the operation execution time information when the main MCU has received the diagnostic signal from the BMIC through the communication unit, generates an operation execution command signal for instructing the auxiliary MCU to immediately perform the operation corresponding to the diagnostic signal when the main MCU does not perform the operation within the time indicated by the operation execution time information as a result of the determination, and transfers the execution command signal to the auxiliary MCU via the communication monitoring unit so that the operation is performed.

2. The battery pack state parallel-monitoring device of claim 1, wherein the communication monitoring unit transfers the monitored data to the auxiliary MCU regardless of whether the main MCU has received data normally from the BMIC via the communication unit.

3. The battery pack state parallel-monitoring device of claim 1, wherein the communication monitoring unit is configured with a 3-state buffer.

* * * * *